US007038301B2

(12) United States Patent
Seki et al.

(10) Patent No.: US 7,038,301 B2

(45) Date of Patent: May 2, 2006

(54) CONTACT SWITCH FOR HIGH FREQUENCY APPLICATION

(75) Inventors: Tomonori Seki, Nara (JP); Yutaka Uno, Nara (JP); Takahiro Masuda, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 10/727,060

(22) Filed: Dec. 3, 2003

(65) Prior Publication Data

US 2004/0121510 A1 Jun. 24, 2004

(30) Foreign Application Priority Data

Dec. 5, 2002 (JP) ............................ 2002-354041
Oct. 31, 2003 (JP) ............................ 2003-373208

(51) Int. Cl.
*H01L 21/40* (2006.01)

(52) U.S. Cl. ...................... 257/621; 257/621; 257/618

(58) Field of Classification Search ................ 257/621, 257/618, 619, 624
See application file for complete search history.

(56) References Cited

U.S. PATENT DOCUMENTS 6,396,372 B1 * 5/2002 Sakata et al. ................ 335/80
6,828,888 B1 * 12/2004 Iwata et al. .................. 335/78
2002/0163408 A1 11/2002 Fujii et al.

FOREIGN PATENT DOCUMENTS

JP 2001-14997 1/2001
WO WO-00/44012 7/2000
WO WO-02/079076 A1 10/2002

OTHER PUBLICATIONS

Patent Abstracts of Japan; Publication No. 2001-014997 dated Jan. 19, 2001 (1 pg.).
European Search Report dated Oct. 13, 2005 (3 pages).
"Fully Integrated Micromachined Capactitive Switches for RF Applications," J.Y. Park et al.: Microwave Symposium Digest 2000 IEEE MTT-S International, Boston, MA, USA Jun. 11-16, 2000, Piscataway, NJ, USA, IEEE, U.S., vol. 1, Jun. 11, 2000, pp. 283-286 (4 pages).

* cited by examiner

*Primary Examiner*—David Nelms
*Assistant Examiner*—Thinh T Nguyen
(74) *Attorney, Agent, or Firm*—Osha Liang LLP

(57) ABSTRACT

A plurality of fixed contacts and signal lines are provided on a fixed substrate. A movable contact which is closed or opened with the fixed contacts is provided on a movable substrate opposed to the fixed substrate. A film thickness of the fixed contacts is made to be smaller than that of the signal lines so that the movable contact is set in a concave portion constituted by the fixed contacts when the fixed contacts, and the movable contact are closed and the signal lines are linearly connected.

7 Claims, 9 Drawing Sheets

PRIOR ART

PRIOR ART

CONTACT SWITCH FOR HIGH FREQUENCY APPLICATION

BACKGROUND OF THE INVENTION

1. Field of the Invention

The present invention relates to a contact switch and an apparatus comprising the contact switch.

2. Description of the Background Art

An electrostatic microrelay which is a form of the conventional contact switch is shown in FIG. 8. In FIG. 8, a perspective view of the electrostatic microrelay is shown in FIG. 8A and its sectional view taken along line b—b is shown in FIG. 8B.

As shown in FIG. 8A, the electrostatic microrelay mainly consists of a fixed substrate 201 comprising a glass substrate or an insulator substrate, and a movable substrate 202 comprising a semiconductor such as silicon (Si).

A fixed electrode 204 coated with an insulating film 203, and two signal lines 205 through which a high frequency signal passes are mainly provided on the one fixed substrate 201. The signal lines 205 are provided so as to be spaced at a predetermined distance and ends of the signal lines provide a couple of fixed contacts 206.

The other movable substrate 202 is fixed through an anchor 207 to be bonded to the fixed substrate 201 so as to be opposed to the fixed substrate 201. In addition, on the movable substrate 202, a movable electrode 208 positioned so as to correspond to the fixed electrode 204 is provided and a movable contact 209 which is electrically insulated from the movable electrode 208 is positioned so as to correspond to the fixed contacts 206.

Then, a first elastic support portion 211 constituted by a notch is formed between the anchor 207 and the movable electrode 208 to elastically support the movable electrode 208, and a second elastic support portion 212 constituted by a notch is formed between the movable electrode 208 and the movable contact 209.

Next, a description is made of operations of the thus constituted electrostatic microrelay according to the prior art.

More specifically, as shown in FIG. 8B, the first elastic support portion 211 and the second elastic support portion 212 are not elastically deformed and a state in which they horizontally extend from the anchors 207 is maintained while a voltage is not applied between the fixed electrode 204 and the movable electrode 208 and electrostatic attraction force is not generated.

Then, when a voltage is applied between the fixed electrode 204 and the movable electrode 208, electrostatic attraction force is generated between them. Then, the movable electrode 208 is drawn to the fixed electrode 204.

Thus, when the electrostatic attraction force acts on the movable electrode 208, the first elastic support portion 211 having elastic force smaller than that of the second elastic support portion 212 is elastically deformed first, and the movable electrode 208 and the movable contact 209 come close to the fixed electrode 204 and the fixed contacts 206, respectively while they keep parallel state thereof. Then, the movable contact 209 comes in contact with the fixed contacts 206 and the two signal lines 205 are electrically connected.

Then, the movable electrode 208 is drawn by the electrostatic attraction force and sticks to the fixed electrode 204. Thus, the second elastic support portion 212 is elastically deformed. Then, the movable contact 209 is pushed to the fixed contacts 206 by spring elasticity caused by the deformation of the second elastic support portion 212.

Thus, according to the electrostatic microrelay, when it is closed, the movable contact 209 and the fixed contacts 206 are closed by two-stage elastic deformation in which the first elastic support portion 211 is elastically deformed first and then, the second elastic support portion 212 is elastically deformed.

When the voltage is cut off, the electrostatic attraction force disappears. Thus, the movable substrate 202 is separated from the fixed substrate 201 by force of restitution of the first elastic support portion 211 and the second elastic support portion 212 and returned to the original position. Accordingly, the movable contact 209 is vertically lifted by this restitution force to be separated from the fixed contacts 206 and electrical connection between the two signal lines 205 is cut off.

In addition, a cap 210 formed of glass is bonded on the upper surface of the fixed substrate 201 through a bonding layer (not shown) in order to protect the movable substrate 202 from an outside foreign substance such as dust.

However, the following problems arises in the contact switch such as the electrostatic microrelay according to the prior art.

Spring design in the contact switch is designated by that F=kx (k: elastic coefficient, x: stroke amount). Therefore, in the case of the above microrelay, the necessary stroke amount is defined by a gap amount between the movable contact 209 and the fixed contacts 206.

However, the gap amount between the contacts is influenced by film thickness variation in the film of the fixed contacts 206 in the device manufacturing process of the contact switch, thickness variation of an insulator for insulating the movable contact 209 from the movable electrode 208 and a conductor for constituting the movable contact 209, and processing precision at the time of processing the contacts.

In this respect, according to the knowledge based on various kinds of experiments performed by the inventor of the present invention, the precision variation in the above described variations is largest at the portion of the fixed contacts 206 (in the circle designated by a dotted line in FIG. 8) formed by the thickest film.

Meanwhile, since the signal lines 205 transmit the high frequency signal with low loss as much as possible, the thickness of the wiring has to be a skin depth or more in consideration of a skin effect.

When variation of the gap amount between the contacts is generated, contact reliability between the movable contact 209 and the fixed contacts 206 in the electrostatic microrelay is influenced.

More specifically, when the gap amount between the contacts is greater than a design value, a distance between the movable electrode 208 and the fixed electrode 204 (distance between electrode gaps) when the movable contact 209 and the fixed contacts 206 are closed and come in contact with each other is smaller than the design value.

Thus, a displacement amount of the movable electrode 208 from the state in which the contacts are closed until the state in which the fixed electrode 204 and the movable electrode 208 come in contact with each other by electrostatic attraction force becomes small, and a displacement amount of the second elastic support portion 212 which starts spring deformation from the state in which the contacts are closed becomes small also. Here, since the deformation of the second elastic support potion 212 is generated while from the state in which the contacts are closed until the electrodes come in contact, force acting on the movable contact 209 from the second elastic support portion 212 is designated by the above described spring design based on the displacement amount set on the basis of the state in which the contacts are closed.

Thus, based on this spring design, the elastic force acting on the second movable contact 209 is decreased because the displacement amount of the movable electrode 208 is decreased. Consequently, the movable contact 209 cannot be sufficiently pushed toward the fixed contacts 206 so that contact reliability cannot be secured.

Meanwhile, when the gap amount between contacts is smaller than the design value, the distance gap between the movable electrode 208 and the fixed electrode 204 when the movable contact 209 and the fixed contacts 206 are closed to be in contact with each other is more than the design value.

Thus, electrostatic attraction force acting on the movable electrode 208 toward the fixed electrode 204 is reduced. When the electrostatic attraction force becomes smaller than the sum of the elastic force of the first elastic support portion 211 and the second elastic support portion 212, a phenomenon in which the fixed electrode 204 and the movable electrode 208 do not contact with each other could occur.

When the fixed electrode 204 does not come in contact with the movable electrode 208, since the elastic displacement amount of the second elastic support portion 212 is reduced, the movable contact 209 cannot be sufficiently pushed toward the fixed contacts 206 by the second elastic support portion 212, based on the above described spring design. In this case also, there arises a problem that the contact reliability between the contacts cannot be obtained.

SUMMARY OF THE INVENTION

One or more embodiments of the present invention provide a contact switch and an apparatus provided with the contact switch, in which variation of the gap amount between contacts is reduced by reducing film thickness variation at the part of the contacts by a simple change of a structure and contact reliability between the contacts when they are closed is secured, and operations can be stabilized.

Still further, one or more embodiments of the present invention provide a contact switch in which high frequency characteristics can be improved and loss in transmission of a high frequency signal can be reduced.

In one or more embodiments of the present invention, a contact switch comprises a first contact provided on a substrate, a second contact to be closed or opened with the first contact, and a plurality of signal lines provided on the substrate, insulated with each other, and connected when the first contact and the second contact are closed, and it is characterized in that a film thickness of the first contact is smaller than that of the signal lines.

According to this constitution, since the wiring film thickness can be set at a desired film thickness without influencing contact force, variation in film thickness at the portion of contacts having film thickness smaller than that of the signal lines can be the minimum, the variation of the gap between the contacts can be reduced, the contact reliability between the contacts when they are closed is secured, and operations can be stabilized. In addition, since a skin depth required for flowing a current can be secured in the film thickness of the signal lines, the high frequency characteristics can be improved and the loss in transmission of the high frequency signal can be reduced.

According to an apparatus using the contact switch of the present invention, the contact switch comprises a first contact provided on a substrate, a second contact to be closed or opened with the first contacts, and a plurality of signal lines provided on the substrate, insulated with each other, and connected when the first contacts and the second contact are closed, and it is characterized in that the contact switch in which a film thickness of the first contacts is smaller than that of the signal lines opens and closes a signal.

The apparatus using the contact switch comprises an apparatus such as a wireless communication equipment or a measuring equipment, which opens and closes the high frequency signal.

According to this constitution, since there can be provided the apparatus in which responsibility is high, and the high frequency signal can be stably opened and closed for a long time with high reliability, high efficiency can be implemented because of low loss, a small size, and low power consumption in these apparatus.

DETAILED DESCRIPTION OF THE INVENTION

Figure 1:
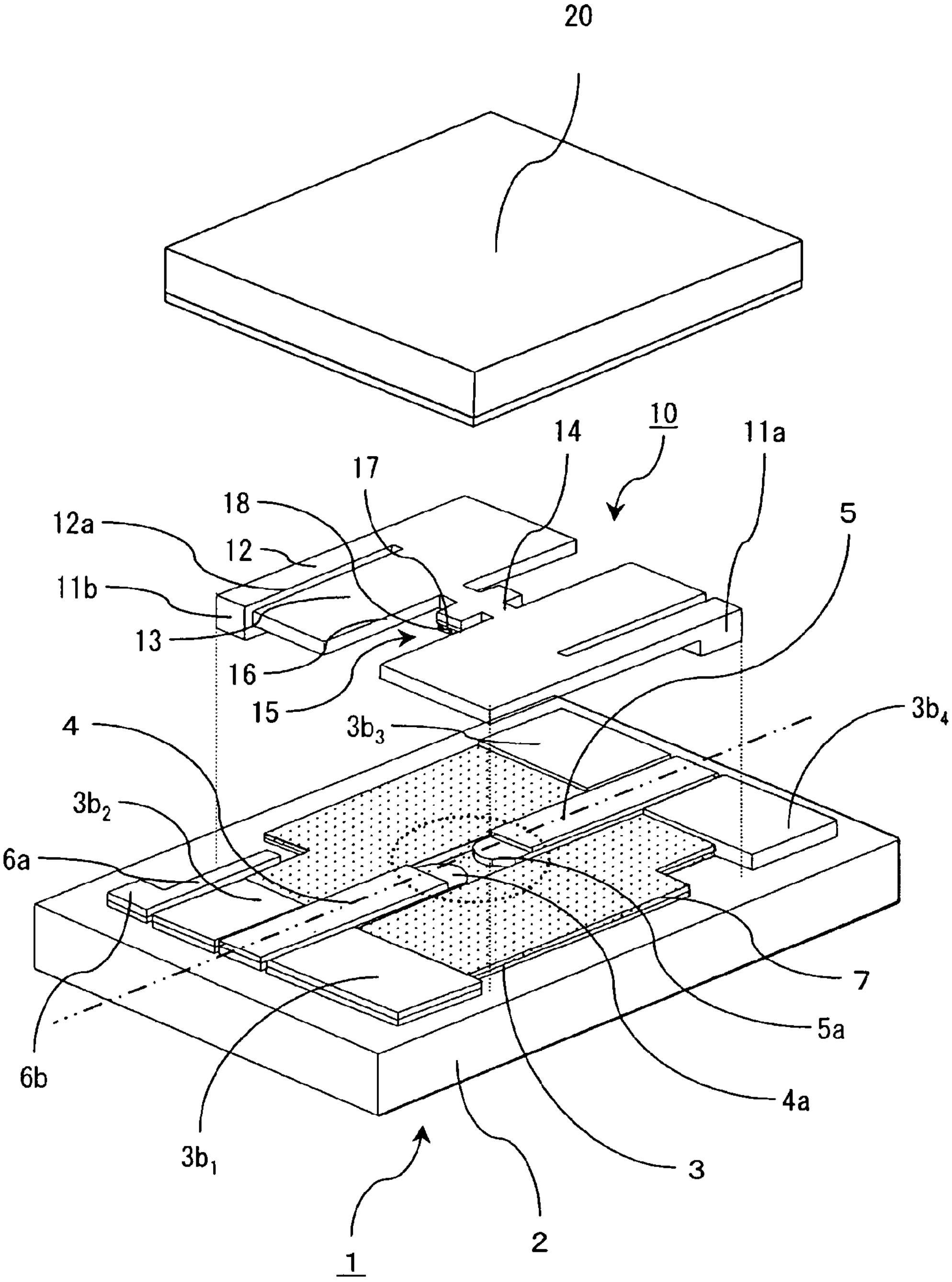
FIG. 1 shows an exploded perspective view showing a microrelay as a contact switch according to a first embodiment of the present invention.

Embodiments of the present invention are described with reference to the drawings hereinafter. In addition, the same reference numerals are allotted to the same or corresponding parts in all drawings of the following embodiments.

First, a contact switch according to a first embodiment of the present invention is described. FIG. 1 shows a microrelay as the contact switch according to the first embodiment.

As shown in FIG. 1, the electrostatic microrelay according to the first embodiment has a constitution in which a movable substrate 10 is integrated on a surface of a fixed substrate 1 at a predetermined distance, and a cap 20 is provided so as to cover the movable substrate 10.

According to the fixed substrate 1, at least one fixed electrode 3 and two signal lines 4 and 5 are provided on an upper surface of a glass substrate 2.

The signal lines 4 and 5 are disposed on the same line (two-dot chain line in FIG. 1). The fixed electrode 3 is provided in a vicinity of the signal lines 4 and 5 at a predetermined distance so as to surround them and its surface is coated by an insulating film 7. Thus, the fixed electrode 3 is used also as a GND electrode (earth electrode) of a high frequency signal transmitting through the signal lines 4 and 5 to constitute Coplanar structure.

In other words, an electric flux line generated when the high frequency signal flows in the signal lines 4 and 5 is terminated at the GND electrode between fixed contacts 4*a* and 5*a* to be described later. Therefore, isolation characteristics can be improved. In addition, the isolation characteristics show how much leakage of the high frequency signal exists between the signals when the contacts are opened. Thus, improvement in the isolation characteristics means reduction of the leakage of the high frequency signal.

External ends of the signal lines 4 and 5 are electrically connected to connection pads $3b_1$ and $3b_2$, and connection pads $3b_3$ and $3b_4$, respectively.

In addition, one end of the signal lines 4 and 5 in the vicinity of the center (inside a circle designated by a dotted line) of the fixed substrate 1 constitute fixed contacts 4*a* and 5*a* disposed at a predetermined distance. The fixed contacts 4*a* and 5*a* are formed so as to have a film thickness smaller than that of the signal lines 4 and 5. More specifically, the signal lines 4 and 5 and the fixed contacts 4*a* and 5*a* have a stepped configuration so as to form a concave portion in the center of the fixed substrate 1.

Thus, the film thickness variation of the fixed contacts 4*a* and 5*a* can be reduced by reducing the film thickness of the fixed contacts 4*a* and 5*a*. In general, an error amount is determined by a ratio to a process amount (basic dimension), when the film thickness is small and the basic dimension becomes small, the absolute value of the error amount can be reduced and the film thickness variation can be reduced.

According to the fixed contacts 4*a* and 5*a* of the first embodiment, in order to make the stepped configuration at the fixed contacts 4*a* and 5*a* of the signal lines 4 and 5, a first electrically conductive layer formed in the same manufacturing process as the fixed electrode 3 is patterned so as to protrude from the signal lines 4 and 5 by the fixed contacts 4*a* and 5*a*.

The signal lines 4 and 5 are formed by laminating a second electrically conductive layer on the first electrically conductive layer. The second conductive layer is formed of silver (Ag), copper (Cu), gold (Au), aluminum (Al) or the like so that the second conductive layer can be conductive with the first conductive layer and the first conductive layer is exposed only at the fixed contacts 4*a* and 5*a* at the one ends of the signal lines 4 and 5. The exposed portions have a configuration in which they can be closed with a movable contact 18 on the movable substrate 10 to be described later.

More specifically, according to the first embodiment, the fixed contacts 4*a* and 5*a* are formed of the same electrically conductive thin film as the fixed electrode 3, and the signal lines 4 and 5 in which the second conductive layer is laminated thereon are formed so as to have a skin depth δ (μm) or more which is determined by the following equation (1) from electric conductivity σ (s/m) of a conductive material (a material of the second conductive layer) mainly constituting the signal lines 4 and 5, and a frequency ν (GHz) of an electric signal passing through the signal lines 4 and 5.

[Equation 1]

$$\delta = \frac{10^5}{2\pi}\sqrt{\frac{1}{\sigma\nu}}\ (\mu m) \tag{1}$$

In addition, referring to representative wiring materials used in the signal lines 4 and 5 according to the first embodiment, the skin depths required for transmitting the predetermined frequency signal are shown in Table 1. Table 1 shows that the skin depth depends on the material of the signal lines and the frequency of the electric signal passing through the signal lines.

TABLE 1

| | | Frequency (GHz) | | | | | | |
|---|---|---|---|---|---|---|---|---|
| | | 0.1 | 0.3 | 0.5 | 1 | 3 | 5 | 10 |
| Skin Depth (μm) | Silver | 6.44 | 3.72 | 2.88 | 2.04 | 1.18 | 0.91 | 0.64 |
| | Copper | 6.61 | 3.82 | 2.96 | 2.09 | 1.21 | 0.93 | 0.66 |
| | Gold | 7.86 | 4.54 | 3.52 | 2.49 | 1.44 | 1.11 | 0.79 |
| | Aluminum | 7.96 | 4.59 | 3.56 | 2.52 | 1.45 | 1.13 | 0.80 |

According to the first embodiment, since the film thickness of the signal lines 4 and 5 is determined so as to be the skin depth or more, which is determined depending on the wiring material mainly constituting the signal lines 4 and 5 and the frequency of the signal used in an apparatus provided with the contact switch, the high frequency signal can be transmitted with low loss. Furthermore, even when the film thickness of the fixed contacts 4*a* and 5*a* is not more than the skin depth, if the sum of the film thicknesses of the fixed contacts 4*a* and 5*a* and the movable contact 18 is the skin depth or more when they are closed with the movable contact 18 to be described later, the high frequency signal can be transmitted with low loss.

Thus, since the film thickness of the fixed contacts 4*a* and 5*a* can be set small without receiving limitation of the skin depth by forming the fixed contacts 4*a* and 5*a* of the signal lines 4 and 5 into the stepped configuration, its variation amount can be reduced as compared to the prior art.

In addition, according to the multilayer constitution for securing the film thickness of the other signal lines 4 and 5, the wiring portion 6*a* and the connection pads $3b_1$ to $3b_4$ and 6*b*, since there is no influence on the gap amount between the contacts, the degree of freedom is increased for film thickness. Therefore, when their conductive layers are formed, a general film forming method can be employed and a sufficient film thickness considering a skin effect can be obtained.

In addition, the conductive materials shown in Table 1 have low adhesiveness with the insulating material such as the glass substrate 2 in many cases. Therefore, when the substrate formed of the insulating material such as the glass substrate 2 like in the first embodiment is used, it is preferable that the first conductive layer is an adhesive layer formed of a conductive material such as chrome (Cr), titanium (Ti), or a conductive compound and then the conductive material constituting the second conductive layer is disposed on this adhesive layer.

In addition, in order to prevent mutual diffusion between the conductive materials constituting the adhesive layer and the second conductive layer, there may be provided a structure in which a diffusion prevention layer formed of nickel (Ni), ruthenium (Ru), tungsten (W), tantalum (Ta), or the like is provided between the second conductive layer and the adhesive layer.

Then, the adhesive layer, or the laminated film consisting of the adhesive layer and diffusion prevention layer forms the first conductive layer, and the first conductive layer is used for the fixed electrode 3 and the fixed contacts 4*a* and 5*a*. Thus, the fixed electrode 3 and the fixed contacts 4*a* and 5*a* can be formed at the same manufacturing process. Therefore, after the signal lines 4 and 5 are formed, the fixed contacts 4*a* and 5*a* can be formed only by changing a mask configuration of patterning such as wiring without newly adding a process for forming the stepped configuration.

Meanwhile, a silicon (Si) substrate is processed to form the movable substrate 10, on which anchors 11*a* and 11*b*, a first elastic support portion 12, a movable electrode 13, a second elastic support portion 14, and the movable contact portion 15 are formed.

More specifically, in the movable substrate 10, the movable electrodes 13 are supported by the first elastic support portions 12 as two first beam portions which extend sideward from the anchors 11*a* and 11*b* which are to be bonded on the upper face edge of the fixed substrate 1.

The anchors 11*a* and 11*b* are positioned so as to be almost point symmetrical about the movable contact portion 15 with each other and constituted so as to be set in two portions in the upper face of the fixed substrate 1. In addition, one anchor 11*b* is electrically connected to the connection pad 6*b* through the wiring portion 6*a* provided on an upper face of the fixed substrate 1.

Furthermore, the first elastic support portions 12 are constituted by slits 12*a* formed into a configuration in which upper end portions of the anchors 11*a* and 11*b* are extended. The first elastic support portions 12 have a thickness smaller than that of the anchors 11*a* and 11*b* and spaced from the fixed substrate 1 at a predetermined distance.

In addition, the movable electrode 13 is supported by an end portion on the opposite side of the first elastic support portion 12 to the anchors 11*a* and 11*b*, and positioned so as to be opposed to the fixed electrode 3 at a predetermined distance.

Thus, the movable electrode 13 is constituted so as to be drawn to the side of the fixed electrode 3 by electrostatic attraction force generated when a voltage is applied between the fixed electrode 3 and the movable electrode 13.

Still further, the second elastic support portion 14 serving as a second beam consisting of a pair of connection portions are formed in the center of the movable electrode 13. The movable substrate 10 is constituted such that the movable contact portion 15 is elastically supported in the center of the elastically supported movable electrode 13 through the second elastic support portion 14.

The second elastic support portion 14 and the movable contact portion 15 are formed by a portion remained after a notched portion 16 is notched from both edges of the movable substrate 10 toward the center thereof. The second elastic support portion 14 is a beam having a narrow width which connects the movable electrode 13 to the movable contact portion 15, which is formed so as to be able to secure elastic force stronger than that of the first elastic support portion 12 when the contacts are closed. In addition, the movable contact portion 15 protrudes toward the anchors 11*a* and 11*b* so as to be thicker than the second elastic support portion 14 by a reduced film thickness of the fixed contacts 4*a* and 5*a*.

In addition, a movable contact 18 is provided in the center of the movable contact portion 15 on the side of the fixed substrate 1 through the insulating film 17. The movable contact 18 is provided so as to be opposed to the fixed contacts 4*a* and 5*a* so that they can be in contact with each other or separated from each other. The movable contact 18 is formed to electrically connect the signal lines 4 and 5 with each other when it is closed with the isolated respective fixed contacts 4*a* and 5*a*.

Figure 2:
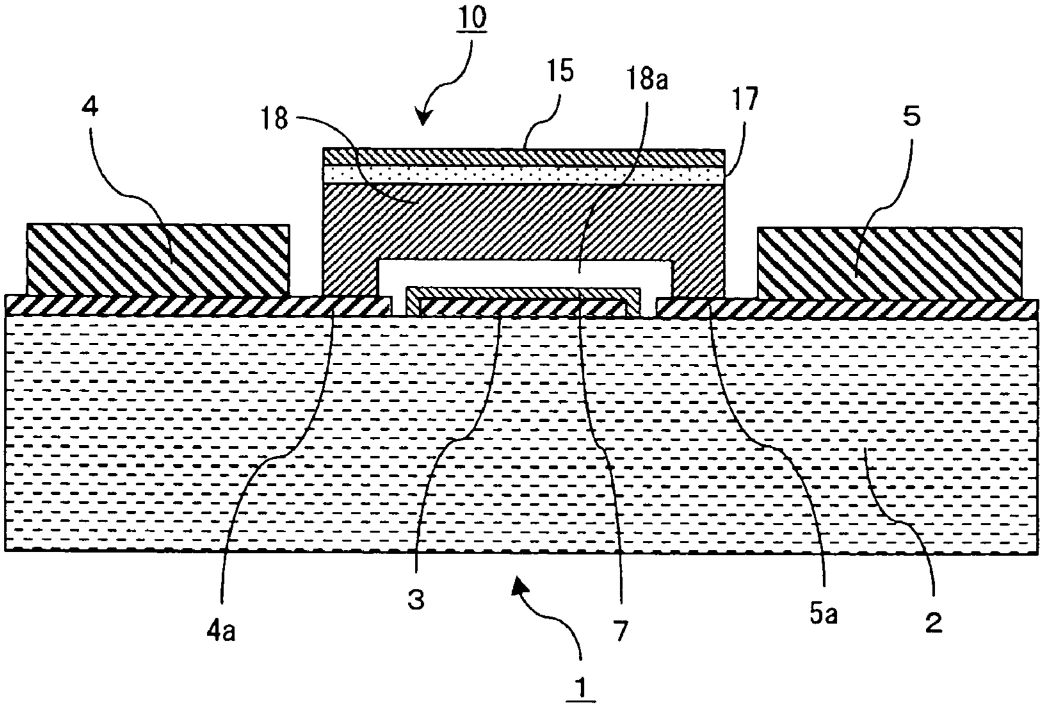
FIG. 2 shows sectional views showing the microrelay as the contact switch when it is closed according to the first embodiment of the present invention.

Furthermore, as shown in FIG. 2, a concave portion 18*a* formed of a cavity in which a predetermined clearance is added to a height of the insulating film 7 is provided in a part of the movable contact 18 opposed to the fixed electrode 3 (that is, a part could be in contact with the fixed electrode 3) on the side of the fixed substrate 1. More specifically, the double-break movable contact 18 is constituted so as to have at least two stepped heights and positioned at a space between the signal lines 4 and 5 when the movable contact 18 and the fixed contacts 4*a* and 5*a* are closed.

Thus, when the movable contact 18 and the fixed contacts 4*a* and 5*a* are closed or opened, the movable contact 18 can be prevented from coming in contact with the fixed electrode 3, and an influence such as an increase in noise in the high frequency signal can be avoided.

At least a portion opposed to the signal lines 4 and 5 is removed by the notched portion 16 in the movable electrode 13. Therefore, since capacity coupling is reduced between the movable electrode 13 and the signal lines 4 and 5, the isolation characteristics can be improved.

Furthermore, the movable substrate 10 is sealed by the cap 20 in a state in which the movable substrate 10 is fixed to the fixed substrate 1 to constitute the microrelay according to the first embodiment.

Operations of the microrelay constituted as described above are described. FIG. 3 shows operating states of the microrelay according to the first embodiment.

Figures 3A, 3B, 3C:
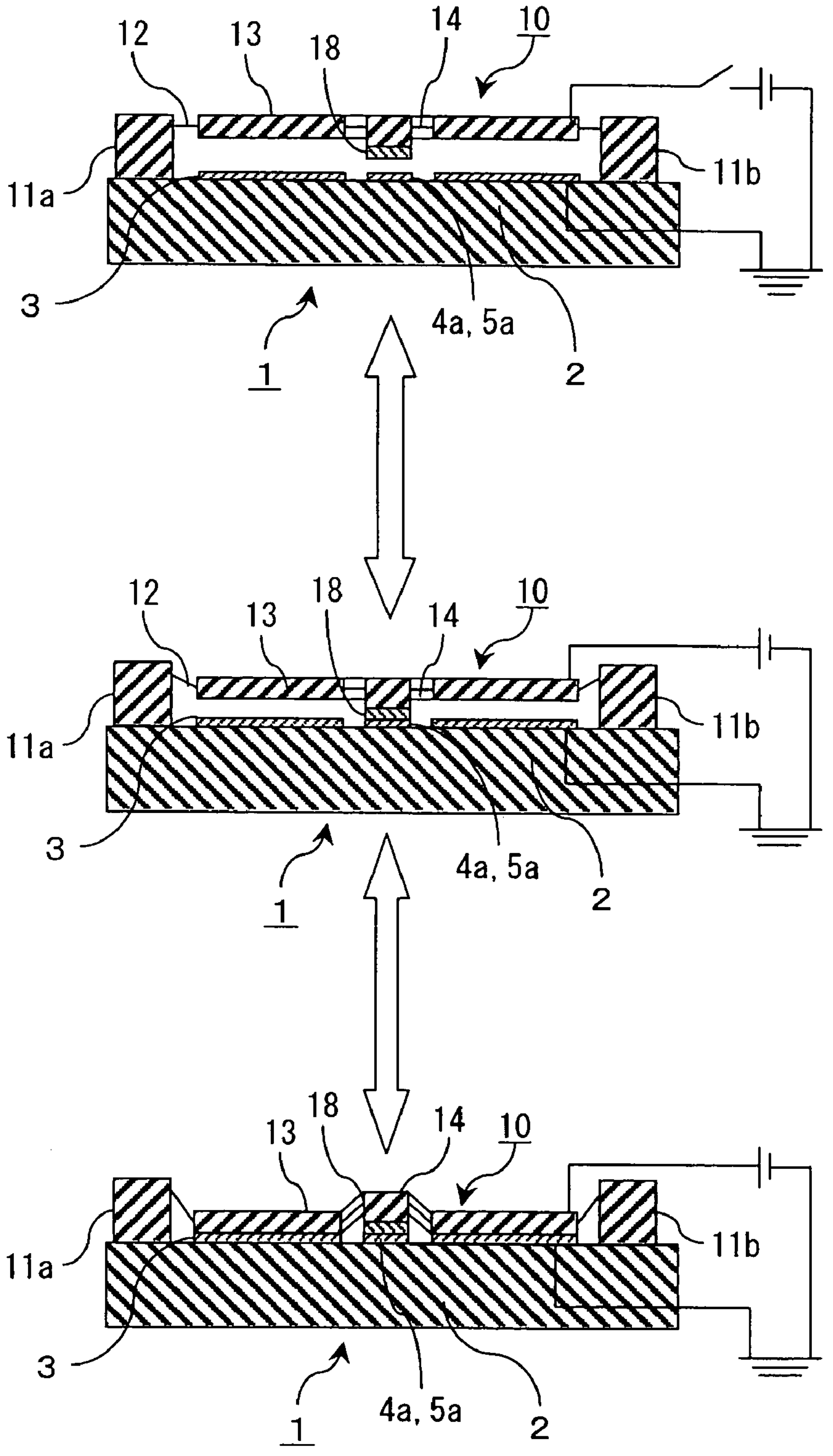
FIG. 3 shows sectional views showing operations of the microrelay as the contact switch according to the first embodiment of the present invention.

First, as shown in FIG. 3A, the first elastic support portions 12 is not elastically deformed in a state in which a voltage is not applied between the fixed electrode 3 and the movable electrode 13 and electrostatic attraction force is not generated, and maintains a state in which they extend from the anchors 11*a* and 11*b* horizontally. Thus, the movable substrate 10 is opposed to the fixed substrate 1 at a predetermined distance. At this time, the movable contact 18 is separated from the fixed contacts 4*a* and 5*a*.

Then, when a voltage is applied between the fixed electrode 3 and the movable electrode 13 and the electrostatic attraction force is generated, the first elastic support portion 12 having elastic force smaller than that of the second elastic support portion 14 is elastically deformed first as shown in FIG. 3B, and the movable electrode 13 comes close to the fixed electrode 3. At this time, the movable contact 18 comes in contact with the fixed contacts 4*a* and 5*a* because the movable electrode 13 around it is drawn toward the fixed electrode 3.

Then, the movable electrode 13 sticks to the insulating film 7 which coats the fixed electrode 3 as shown in FIG. 3C. Thus, the second elastic support portion 14 is elastically deformed and the movable contact 18 is pressed toward the fixed contacts 4*a* and 5*a* by the spring elasticity of the second elastic support portion 14.

Then, when the applied voltage between the fixed electrode 3 and the movable electrode 13 is cut off, elastic force of restitution of the first elastic support portion 12 and the second elastic support portion 14 is generated as force for separating the contacts. Then, when the movable electrode 13 is separated from the fixed electrode 3, it returns to the state where they are separated at a predetermined distance from the state shown in FIG. 3C to the state shown in FIG. 3A through the state shown in FIG. 3B.

According to the thus operating microrelay, the signal is cut off in the state shown in FIG. 3A and the signal is transmitted in the states shown in FIGS. 3B and 3C. Thus, the signal is opened and closed.

Next, a manufacturing method of the thus constituted microrelay according to the first embodiment is described with reference to the drawing. FIG. 4 shows manufacturing processes of the microrelay according to the first embodiment.

Figures 4A, 4B, 4C, 4D, 4E, 4F, 4G, 4H, 4I:
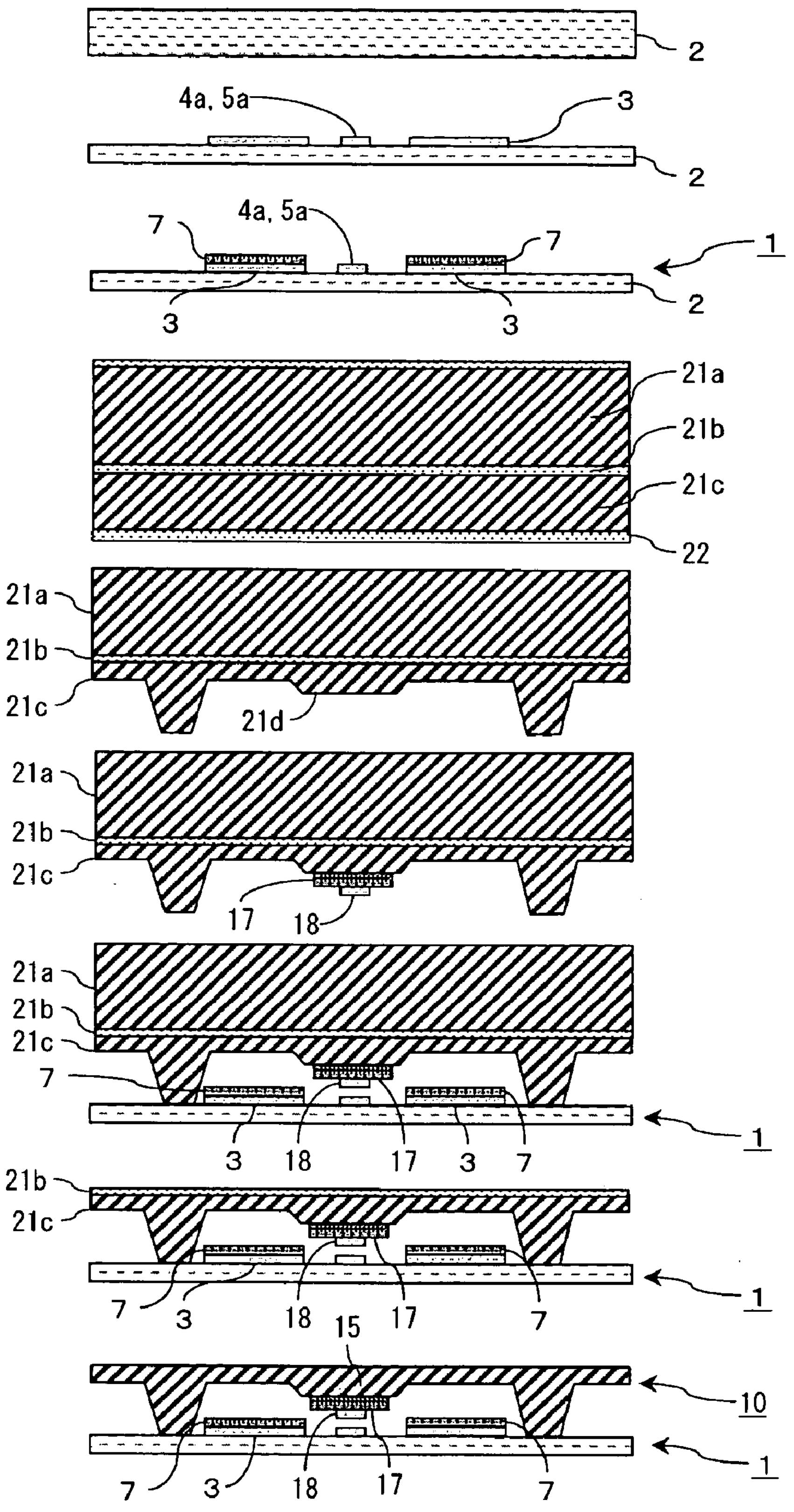
FIG. 4 shows sectional views showing manufacturing processes of the microrelay as the contact switch according to the first embodiment of the present invention.

More specifically, referring to the one fixed substrate 1, an electrically conductive layer serving as an adhesive layer and a diffusion prevention layer is formed on the glass substrate 2 shown in FIG. 4A and patterned to form a lower conductive layer (the first conductive layer) of the signal lines 4 and 5 including the fixed electrode 3 and the fixed contacts 4*a* and 5*a* as shown in FIG. 4B. Then, a print wiring, a connection pad, and an upper layer of the signal lines (the second conductive layer) are formed thereon (not shown in FIG. 4).

Then, the insulating film 7 is formed on the fixed electrode 3. Thus, the fixed substrate 1 shown in FIG. 4C is formed. As the insulating film 7, silicon oxide ($SiO_2$) film having a dielectric constant of 3 to 4, a silicon nitride (SiON, $Si_3N_4$) film having a dielectric constant of 7 to 8 or the like is used, for example. Great electrostatic attraction force can be obtained by using these insulating materials when the contacts and the electrodes are opened and closed, whereby the contacting force can be increased.

On the other hand, referring to the movable substrate 10, as shown in FIG. 4D, an etching mask 22 formed of an $SiO_2$ film and having a configuration of a predetermined pattern is formed on a surface of an SOI (Silicon On Insulator) wafer on which a silicon (Si) layer 21*a*, a silicon oxide ($SiO_2$) layer 21*b* and Si layer 21*c* are sequentially formed from the upper side. In addition, as the etching mask, a normal resist pattern may be used.

Then, the Si layer 21*c* is etched away using the etching mask 22 as a mask. Then, as shown in FIG. 4E, the anchors 11*a* and 11*b* protruding downward are formed. In addition, a convex portion 21*d* is formed by reducing an etching amount at the portion, where the movable contact portion 15 is formed, in the Si layer 21*c*.

Then, as shown in FIG. 4F, the insulating film 17 is selectively formed at a region of the convex portion 21*d* on the surface of the SOI substrate 21 at a predetermined distance between the contacts. Then, the movable contact 18 is formed on the insulting film 17. Since the convex portion 21*d* is formed at the movable contact 18, the gap amount between the contacts is the same while the film thickness of the movable contact can be equally maintained like in the prior art.

Then, as shown in FIG. 4G, while the movable contact 18 is aligned with the fixed contacts 4*a* and 5*a*, the one movable substrate 10 as the base and the other fixed substrate 1 are bonded to be integrated by an anode bonding method.

Then, as shown in FIG. 4H, the upper surface of the SOI substrate 21 is etched away using the $SiO_2$ layer 21*b* as an etching stop layer, by a wet etching method using alkali etching solution such as potassium hydroxide so that the film is thinned.

Then, the $SiO_2$ layer 21*b* is removed using fluorine etching solution and the movable substrate 10 formed of the Si layer 21*c*, on which the movable electrode 13 is formed is exposed as shown in FIG. 3I.

Then, die-cut etching is performed by a dry etching method such as a reactive ion etching (RIE) method, for example. Thus, the notched portion and connecting portion are formed and the first elastic support portion 12 and the second elastic support portion 14 are provided and the movable substrate 10 is completed.

Finally, dicing is performed using a laser or a cutter and a microrelay is cut out and the microrelay according to the first embodiment is provided.

As described above, according to the first embodiment, since the film thickness of the portion of the fixed contacts 4*a* and 5*a* of the signal lines 4 and 5 is thinned by forming the stepped configuration, variation of the gap amount between the contacts can be reduced as compared to with the prior art. Furthermore, since the film thickness of the signal transmitting portion such as other signal lines 4 and 5, the wiring portion 6*a*, the connection pad $3b_1$ to $3b_4$ or the like can be determined regardless of the gap amount between the contacts, the degree of freedom regarding the film thickness variation can be increased and a sufficient film thickness considering a skin effect can be obtained.

Then, a description is made of a contact switch according to a second embodiment of the present invention. FIG. 5 shows a sectional view of a microrelay according to the second embodiment when it is closed.

Figure 5A:
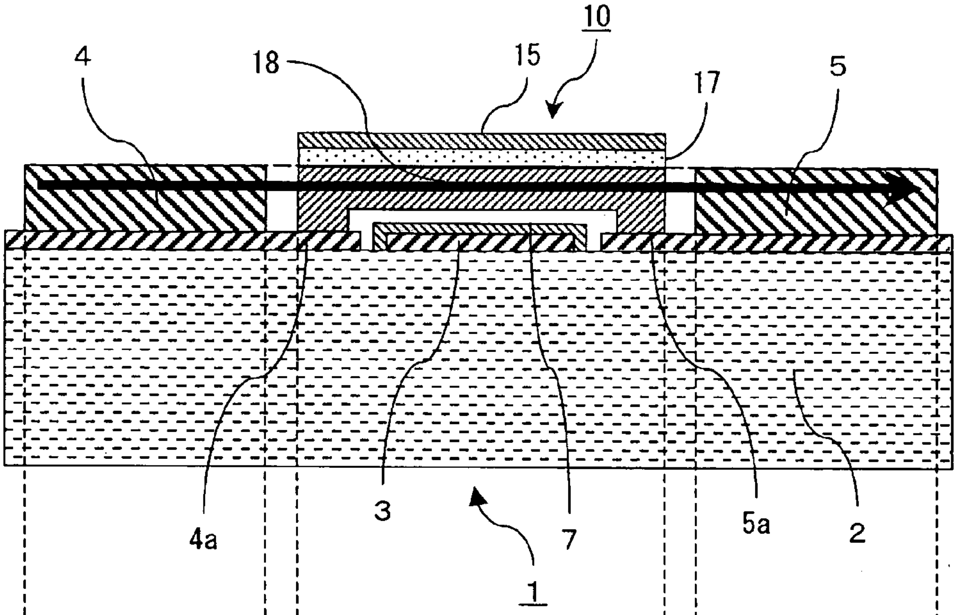
FIG. 5 shows a sectional view and a plan view showing a contact portion of the microrelay as the contact switch when it is closed and a transmitting state of a high frequency signal according to the second embodiment of the present invention.

As shown in FIG. 5A, the microrelay according to the second embodiment is constituted such that a height of an upper face of a movable contact 18 and heights of the signal lines 4 and 5 may be the same when the movable contact 18 and the fixed contacts 4*a* and 5*a* are closed.

Figure 5B:
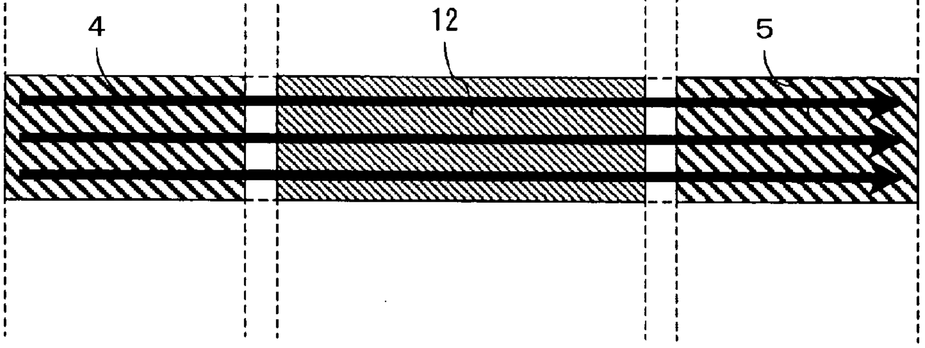

Still further, according to the second embodiment, as shown in FIG. 5B which is a top view of the signal lines 4 and 5 and the movable contact 18 shown in FIG. 5A, a width of the movable contact 18 in the direction perpendicular to the longitudinal direction of the signal lines 4 and 5 (referred to as a width hereinafter) may be almost the same as that of the signal lines 4 and 5. Thus, mismatching can be considerably controlled as compared to the prior art.

Since other constitutions of the microrelay according to the second embodiment are the same as in the first embodiment, a description thereof is omitted.

Figure 9:
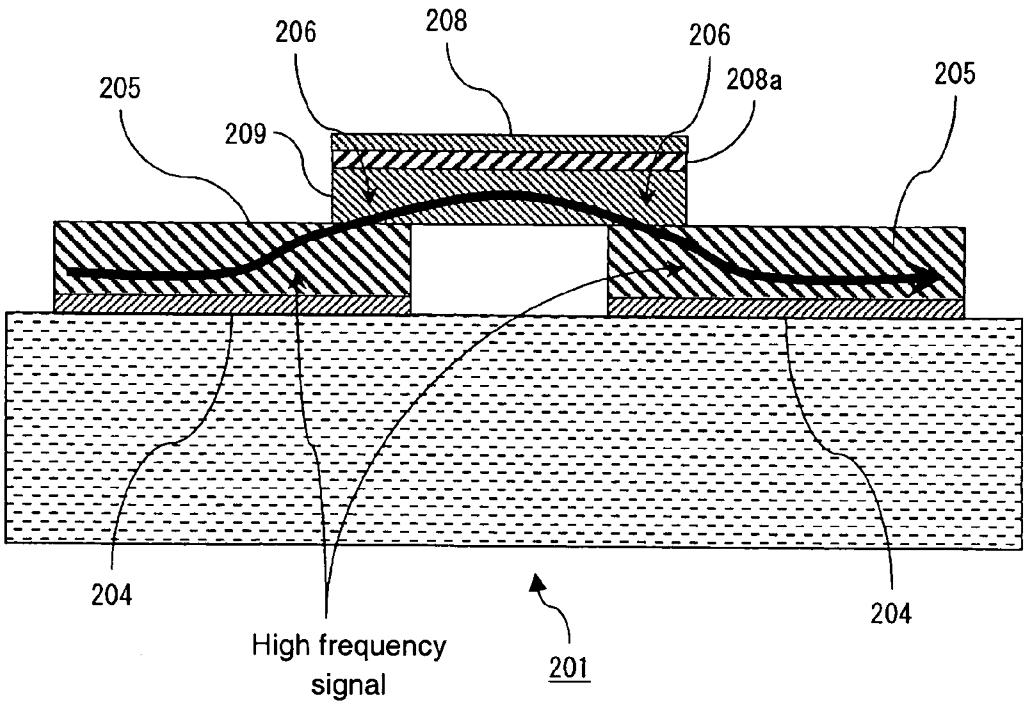
FIG. 9 shows a sectional view for explaining a problem referring to transmission of a high frequency signal in the contact switch according to the prior art.

As described above, according to the second embodiment, since the same effect as in the first embodiment can be provided. Although the transmission of the high frequency signal is bent at the contact portion, so that mismatching of impedance is generated and the high frequency signal is lost when the conventional contact switch is used in opening and closing the high frequency signal as shown in FIG. 9, according to the contact switch of this second embodiment, the loss of the high frequency signal when the fixed contacts 4*a* and 5*a* and the movable contact 18 are closed can be reduced even in the case of the further high frequency signal. Consequently, the mismatching of impedance at the contact portion can be further improved and the loss of the high frequency signal can be further reduced.

Then, according to a third embodiment of the present invention, an apparatus provided with the microrelay of the present invention is described. As an example of the apparatus mounting the microrelay according to the third embodiment, FIG. 6 shows a wireless communication equipment and FIG. 7 shows a measuring equipment.

More specifically, the microrelay according to the present invention provides characteristics capable of favorably transmitting the high frequency signal especially with low loss because of its structure characteristics.

Figure 6:
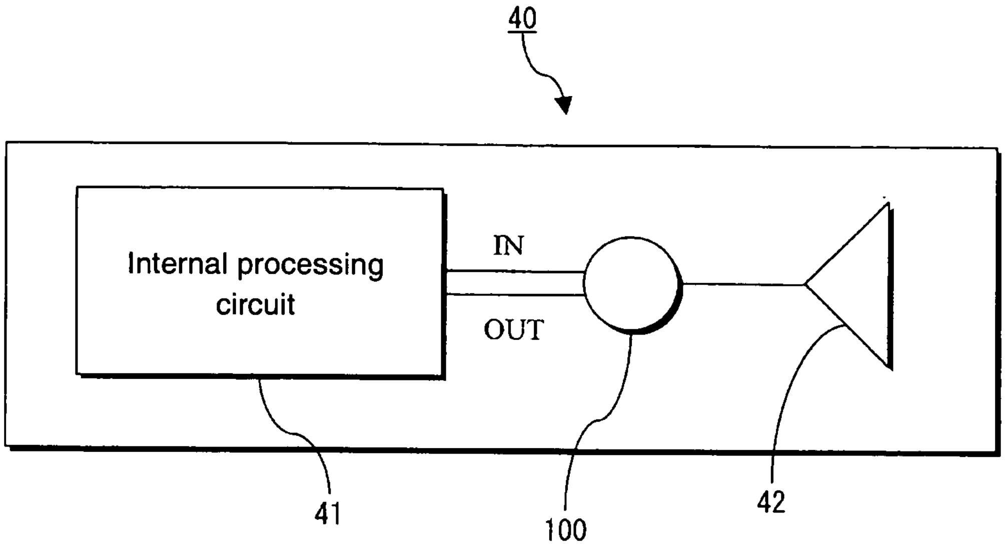
FIG. 6 shows a bock diagram showing a wireless communication equipment as an example of an apparatus provided with the contact switch of the present invention, according to a third embodiment of the present invention.
Figure 7:
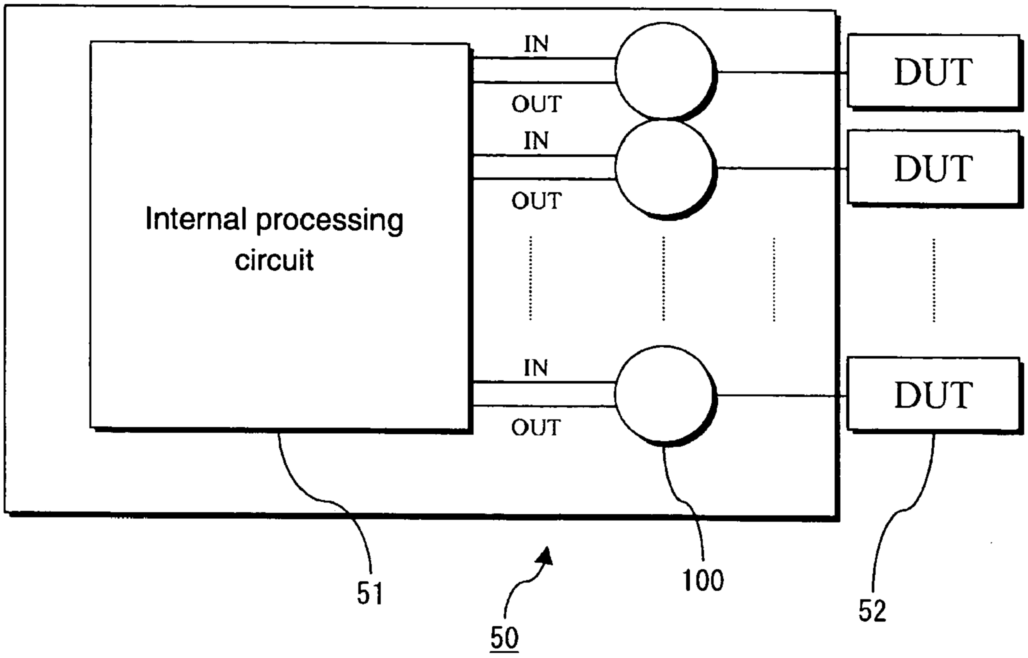
FIG. 7 shows a bock diagram showing a measuring equipment as an example of an apparatus provided with the contact switch of the present invention, according to the third embodiment of the present invention.
Figure 8A:
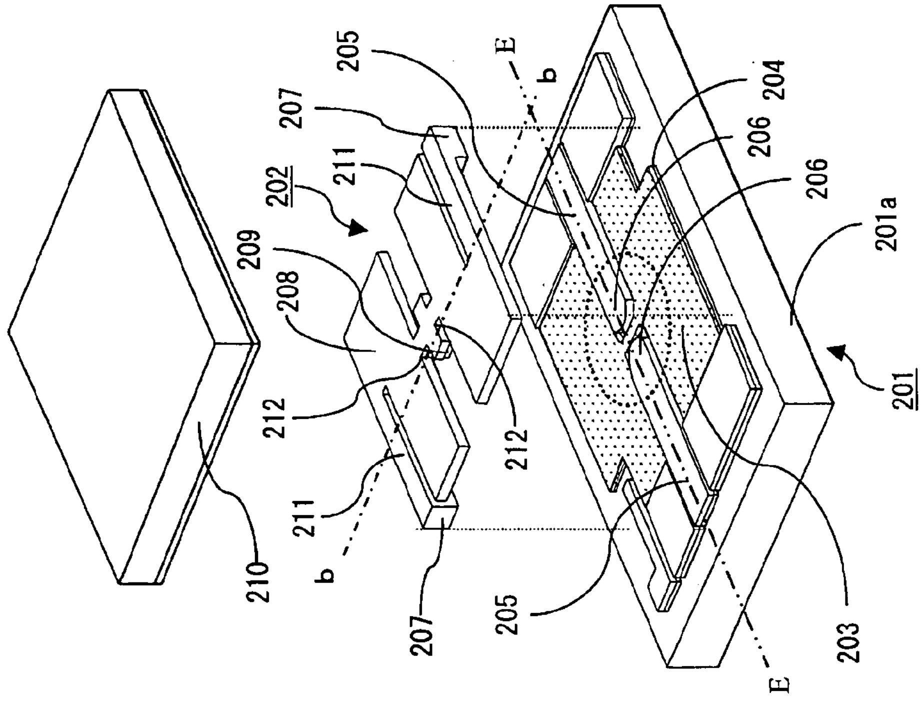
FIG. 8 shows a perspective view showing a structure of a microrelay as a contact switch and sectional views showing its operations according to the prior art.
Figure 8B:
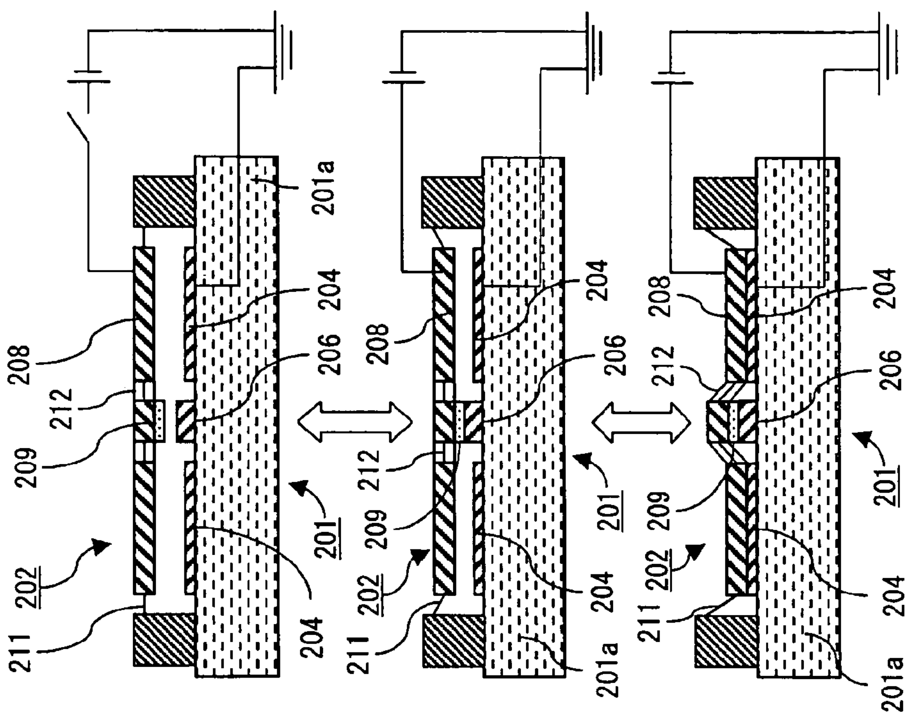
PRIOR ART Fig. 8B

Then, as shown in FIG. 6, using the above characteristics, a microrelay 100 according to the present invention is provided so as to be connected between an internal processing circuit 41 and a two-way antenna 42 in a wireless communication equipment 40. Thus, the microrelay 100 according to the present invention can be used as an antenna switch which is used at a place where the high frequency signal is received from the two-way antenna 42 or the signal is supplied from the internal processing circuit 41 to the two-way antenna 42.

Thus, since the loss of the high frequency signal especially can be reduced by employing the microrelay 100 according to the present invention as the antenna switch as compared to the prior art, a load of an amplifier or the like which is used in an internal circuit can be reduced and high efficiency can be implemented because of low loss, miniaturization and low power consumption.

Furthermore, as shown in FIG. 7, according to a measuring equipment 50, a microrelay 100 is connected in the middle of the signal line extending from an internal processing circuit 51 to a measurement object 52. Thus, since the microrelay 100 of the present invention is used as an output and supply relay between the measurement object 52 and the internal processing circuit 51 of the measuring equipment 50, the signal can be transmitted with high precision because of the characteristics of low loss transmission as compared to the switching device in the prior art.

In addition, according to the above described wireless communication equipment 40 or the measuring equipment 50, a plurality of transmission elements are used in many cases. Therefore, there can be provided great advantage because of small size and low power consumption in view of space efficiency or energy consumption efficiency.

Although the embodiments of the present invention was described in detail in the above, the present invention is not limited to the above embodiments and various kinds of variations based on technical idea of the present invention can be applied.

For example, according to the first embodiment, the first conductive layer constituting the fixed electrode 3 and the fixed contacts 4*a* and 5*a* may be formed of the conductive layer of a single layer, or the conductive layer constituting the fixed electrode 3 and the fixed contacts 4*a* and 5*a* may have a multilayer constitution in which different conductive layers are laminated.

Furthermore, although the material such as Au, Ag, Cu, Al or the like is illustrated as the second conductive layer mainly forming the signal lines 4 and 5 in the above first embodiment, the signal lines 4 and 5 are not always constituted by the single material and they can be constituted by a multilayer film in which the plural kinds of materials are laminated. In addition, the used wiring material is not limited to the above metal material.

Furthermore, although the movable substrate 10 is constituted by processing the Si substrate so that the movable substrate 10 itself becomes a conductor so as to serve as the movable electrode also in the above first embodiment, the movable electrode 13 may be constituted by providing a conductor on the base substrate.

In addition, although description was made of the case where the present invention is applied to the electrostatic microrelay (electrostatic actuator) in the above first to third embodiments, the present invention is not always limited to the electrostatic actuator and can be applied to a piezoelectric actuator or a thermal actuator.

What is claimed is:

1. A contact switch comprising:

a pair of signal lines disposed on a substrate;

a first contact disposed on an end of each of the pair of the signal lines, wherein the first contact faces one another;

a second contact cooperating with the first contact to form a switch, wherein the pair of signal lines are electrically interconnected when the second contact comes into contact with the first contact, and wherein a film thickness of the first contact is smaller than a film thickness of the pair of signal lines.

2. The contact switch according to claim 1, wherein the first contact is formed of a first electrically conductive layer, and the signal line is constituted by sequentially laminating the first conductive layer and a second conductive layer capable of being conducted to the first conductive layer.

3. The contact switch according to claim 2, wherein the first conductive layer and the second conductive layer are formed of different materials.

4. The contact switch according to claim 1, wherein a total of the film thickness of the first contact and a film thickness of the second contact is at least a skin depth depending on a frequency of an electric signal passing through the signal line.

5. The contact switch according to claim 4, wherein the film thickness of the first contact is not more than the skin depth depending on the frequency of the electric signal passing through the signal line.

6. The contact switch according to claim 1, wherein the plural number of the first contacts are formed on the substrate, an electrode insulated from the second contact is provided between the plural first contacts, and the second contact has a configuration in which an insulating state between the second contact and the electrode is maintained when the first contacts and the second contact are closed.

7. The contact switch according to claim 1, wherein an upper surface of a conductive film constituting the second contact and an upper surface of the signal line have almost the same height when the first contact and the second contact are closed.

* * * * *